(12) United States Patent
Byun et al.

(10) Patent No.: US 7,781,268 B2
(45) Date of Patent: Aug. 24, 2010

(54) ARRAY SUBSTRATE AND DISPLAY PANEL

(75) Inventors: Jae-Seong Byun, Suwon-si (KR);
Ho-Min Kang, Suwon-si (KR);
Bae-Hyoun Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 359 days.

(21) Appl. No.: 11/737,626

(22) Filed: Apr. 19, 2007

(65) Prior Publication Data
US 2007/0264735 A1 Nov. 15, 2007

(30) Foreign Application Priority Data
May 15, 2006 (KR) ...................... 10-2006-0043474

(51) Int. Cl.
*H01L 21/82* (2006.01)

(52) U.S. Cl. ................. 438/128; 438/609; 438/151; 438/158; 438/149; 257/66; 257/72; 257/635

(58) Field of Classification Search ................ 438/128, 438/151, 34, 38, 89, 30, 150, 609, 158, 149; 257/383, 66, 72, 635
See application file for complete search history.

(56) References Cited

U.S. PATENT DOCUMENTS

| | | | |
|---|---|---|---|
| 6,777,254 B1 * | 8/2004 | Yamazaki et al. | 438/30 |
| 6,853,405 B2 * | 2/2005 | Lee | 349/39 |
| 7,259,035 B2 * | 8/2007 | Kim | 438/34 |
| 2001/0028071 A1 * | 10/2001 | Yoo et al. | 257/250 |
| 2003/0090604 A1 * | 5/2003 | Song et al. | 349/56 |
| 2004/0125313 A1 * | 7/2004 | Lim | 349/152 |
| 2004/0171200 A1 * | 9/2004 | Maeda et al. | 438/149 |
| 2005/0078233 A1 * | 4/2005 | Lim et al. | 349/43 |
| 2005/0095754 A1 * | 5/2005 | Choi | 438/151 |
| 2006/0097260 A1 * | 5/2006 | Huang | 257/66 |
| 2006/0221031 A1 * | 10/2006 | Chang et al. | 345/89 |
| 2006/0232720 A1 * | 10/2006 | Lee et al. | 349/38 |

FOREIGN PATENT DOCUMENTS

| | | |
|---|---|---|
| JP | 2001-188252 A | 7/2001 |
| KR | 1020010097534 A | 11/2001 |
| KR | 1020050117367 A | 12/2005 |

* cited by examiner

*Primary Examiner*—William M Brewster
*Assistant Examiner*—Wilner Jean Baptiste
(74) *Attorney, Agent, or Firm*—Innovation Counsel LLP

(57) ABSTRACT

A manufacturing method for an array substrate, comprising forming a gate metal on a base substrate, patterning the gate metal to form a gate part having a gate electrode, a gate line and a gate pad. Then, a gate insulating layer, an active layer and a data metal are sequentially formed on the base substrate to cover the gate part. The data metal is patterned to form a data part having a data electrode, a data pad and a pixel electrode. Then, the exposed portion of the active layer is removed, and the exposed portion of the gate insulation layer is removed. When the data electrode is divided into a source electrode and a drain electrode, a switching device is completed.

19 Claims, 8 Drawing Sheets

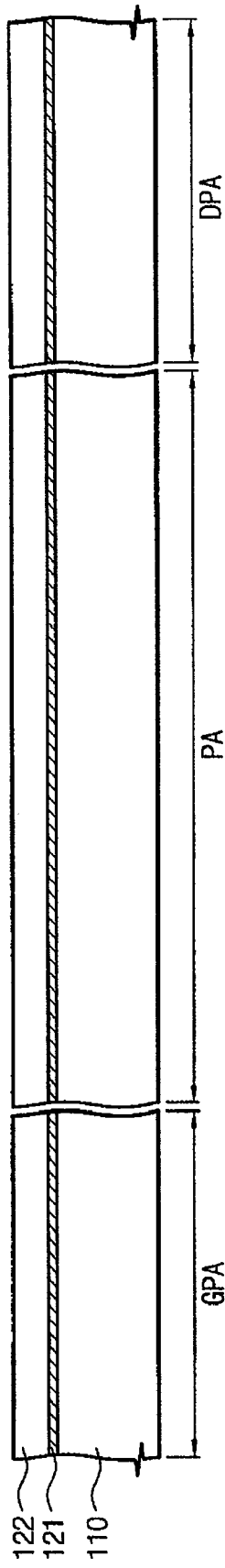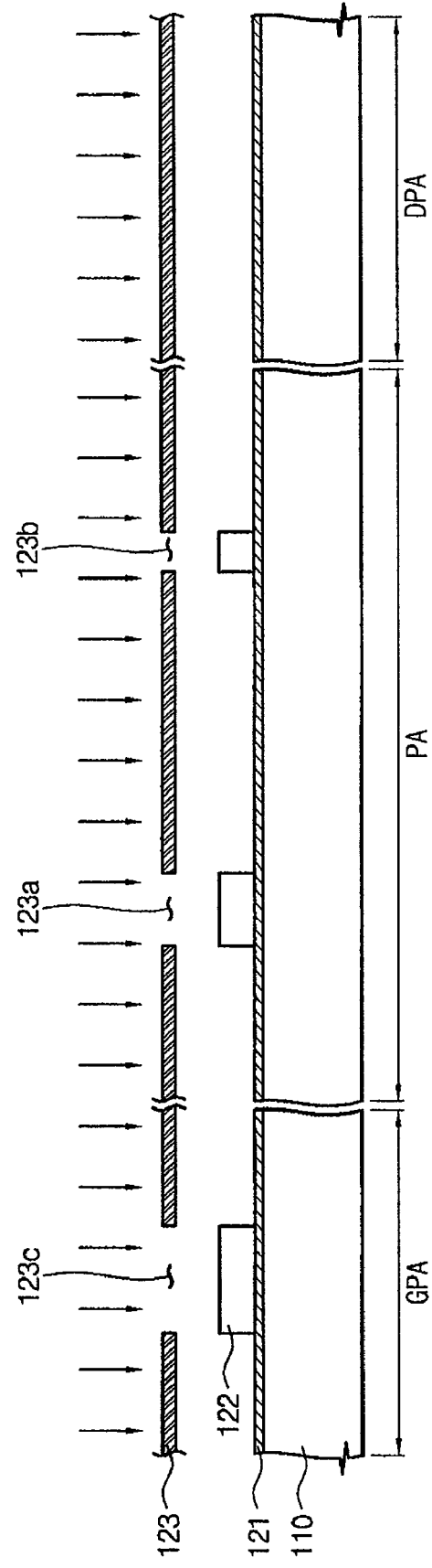

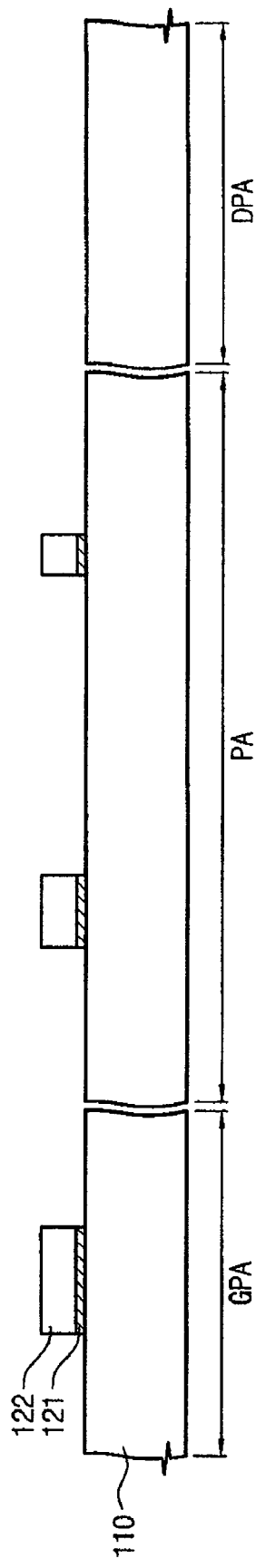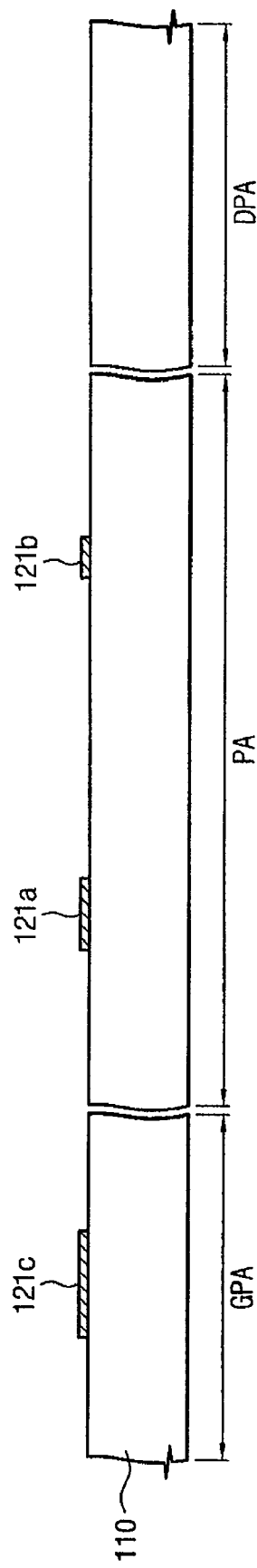

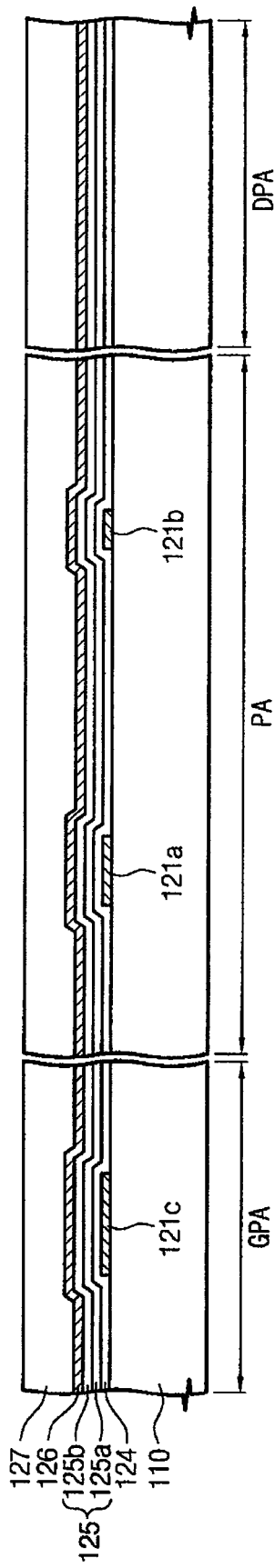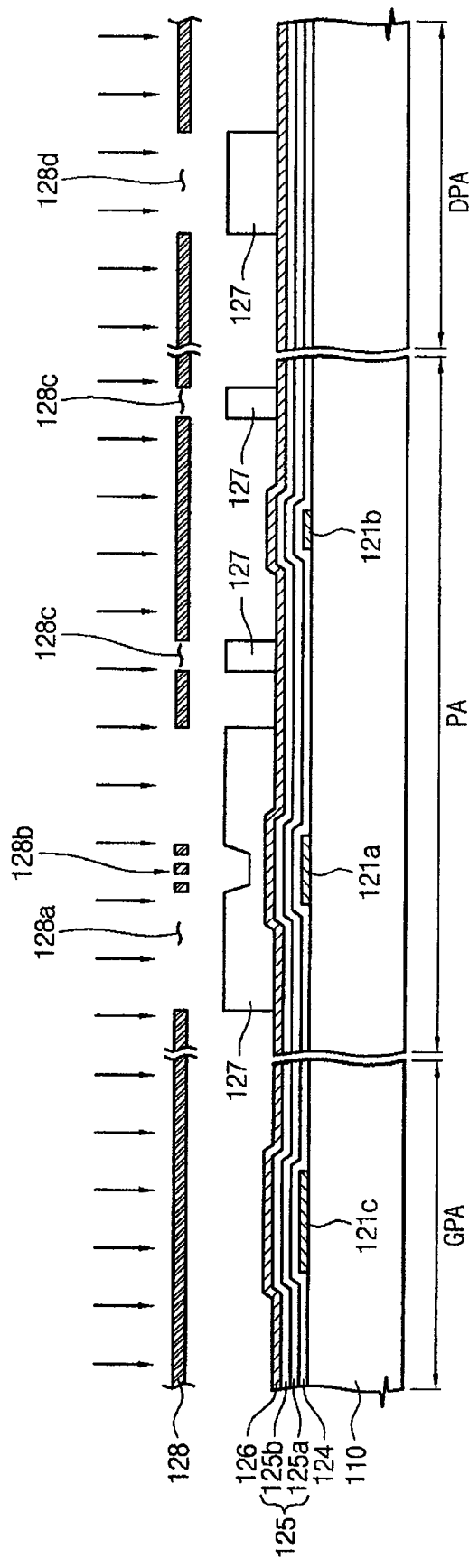

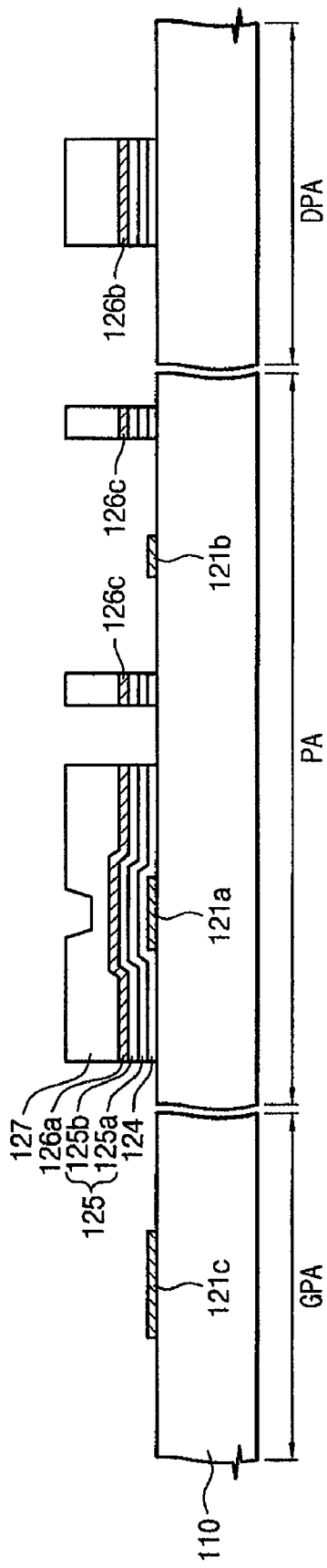
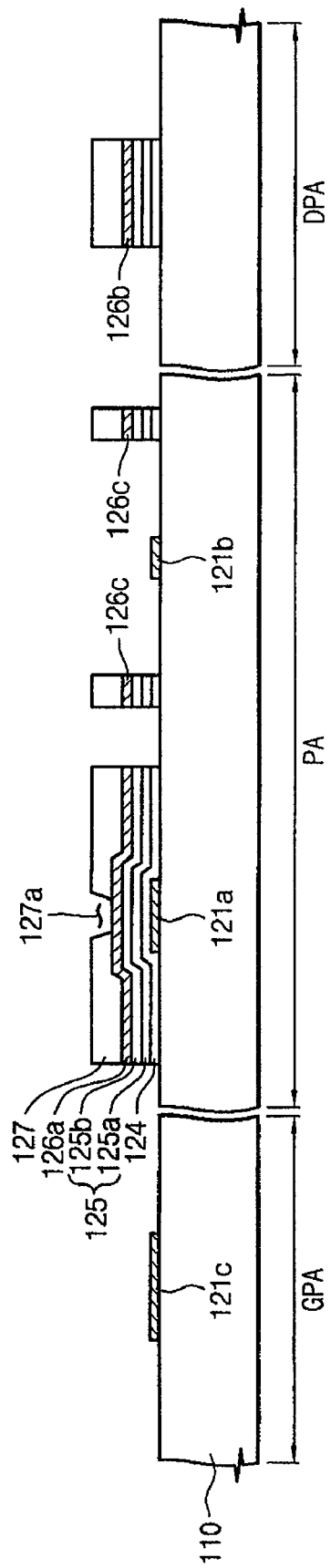

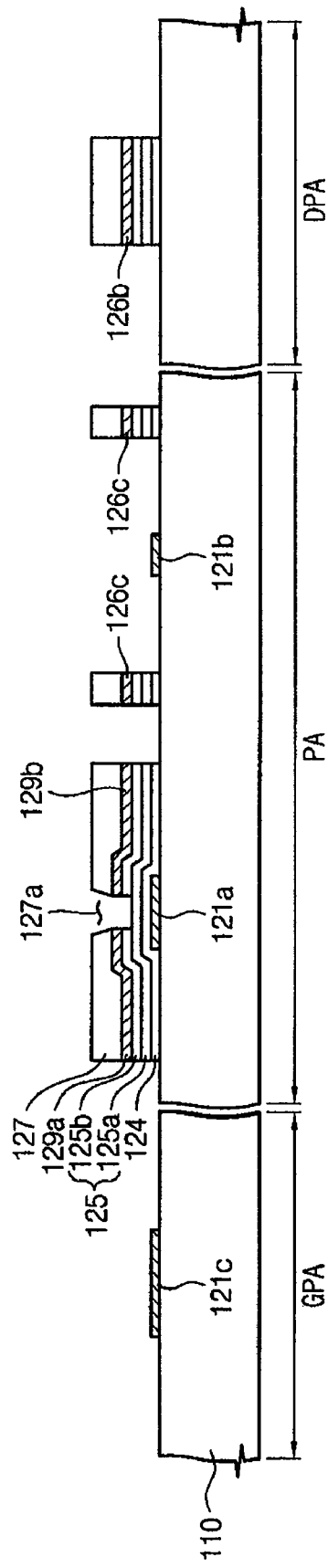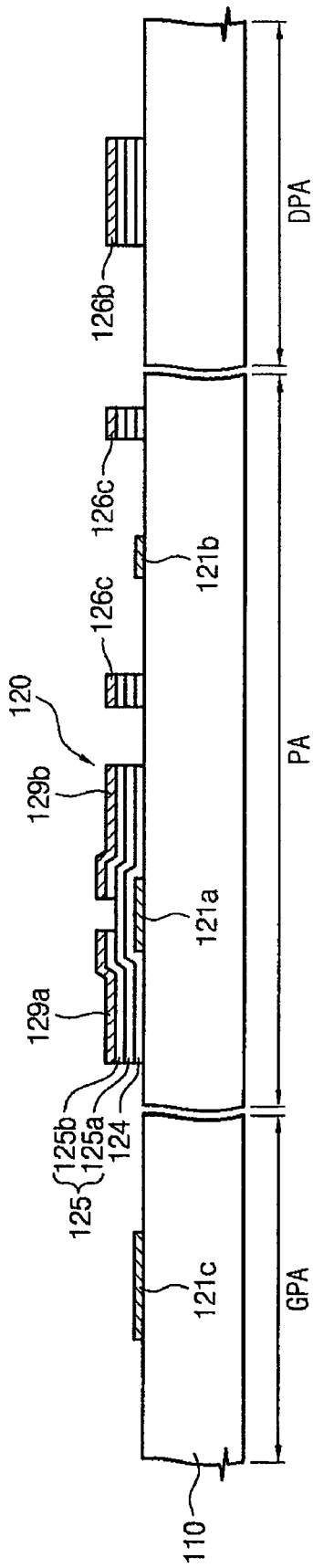

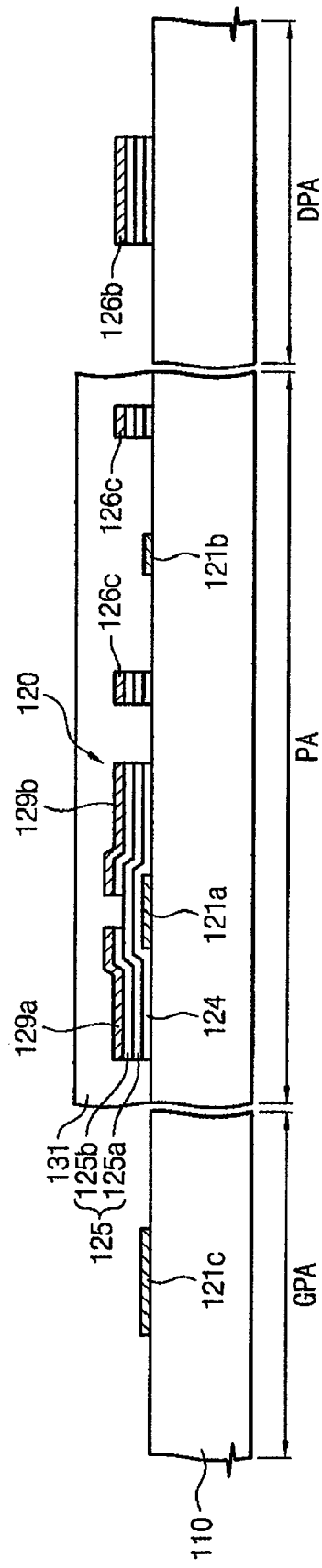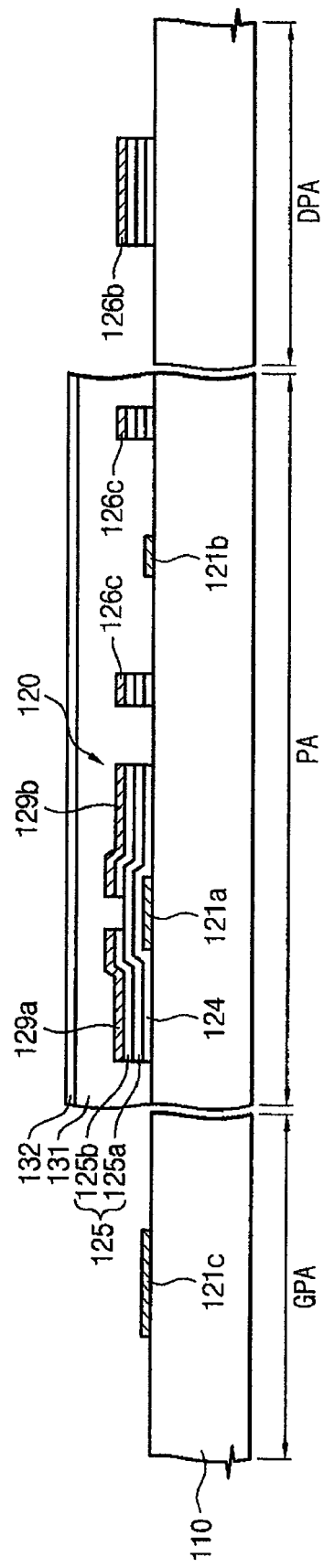

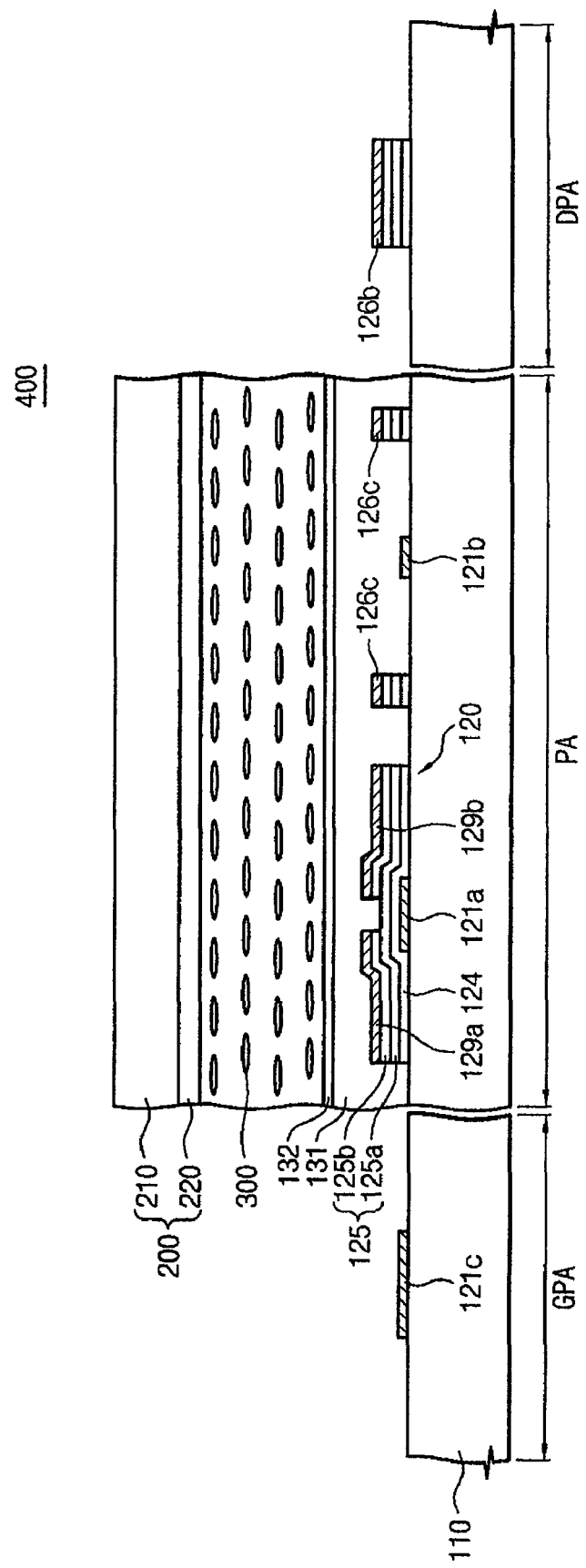

ARRAY SUBSTRATE AND DISPLAY PANEL

CROSS-REFERENCE TO RELATED APPLICATION

This application relies for priority upon Korean Patent Application No. 2006-43474 filed on May 15, 2006, the contents of which are herein incorporated by reference.

FIELD OF THE INVENTION

The present invention relates to a method of manufacturing an array substrate and a display panel.

DESCRIPTION OF THE RELATED ART

In general, an in-plane switching (IPS) mode liquid crystal display includes an array substrate, a color filter substrate facing the array substrate and a liquid crystal layer interposed between the array substrate and the color filter substrate. In the IPS mode liquid crystal display, a common electrode to which a common voltage is applied and a pixel electrode to which a data voltage is applied are formed together on the array substrate. The horizontal electric field so generated is substantially parallel to the array substrate and horizontally aligns the liquid crystal molecules in the liquid crystal layer. To display a desired image, the alignment of the liquid crystal molecules will be controlled by a data voltage to vary the transmittance of light provided from the rear of the array substrate.

To manufacture the array substrate employed in a conventional IPS mode liquid crystal display, five masks are used, a first mask is applied to form a gate electrode and a common electrode, a second mask is applied to form an active pattern, a third mask is applied to form a source-drain electrode and a pixel electrode, a fourth mask is applied to form a protective layer and a fifth mask is applied to form an organic insulation layer. It would be extremely desirable to simplify the manufacturing processes for the array substrate and reduce the number of the masks used.

SUMMARY OF THE INVENTION

According to one aspect of the present invention an array substrate for a display panel can be manufactured with a reduced number of masks. A gate metal is formed on a base substrate, the gate metal is patterned to form a gate electrode, a gate line and a gate pad. Then, a gate insulating layer, an active layer and a data metal are sequentially formed. The data metal is patterned to form a data part having a data electrode, a data pad and a pixel electrode. Then, an exposed portion of the active layer is removed, and an exposed portion of the gate insulation layer is removed. The data electrode is divided into a source electrode and a drain electrode completing a switching device.

According to the above, the array substrate is formed using only two masks. Thus, fewer masks are used to manufacture the array substrate and the manufacturing processes for the array substrate are simplified.

BRIEF DESCRIPTION OF THE DRAWINGS

The above and other objects, features and advantages of the present invention will become more apparent from a reading of the following detailed description, in which:

FIGS. 2A to 2L are cross-sectional views illustrating a method of manufacturing the array substrate shown in FIG. 1; and FIG. 3 is a cross-sectional view showing another exemplary embodiment of an in-plan switching mode liquid crystal display panel.

DESCRIPTION OF THE EMBODIMENTS

Figure 1:
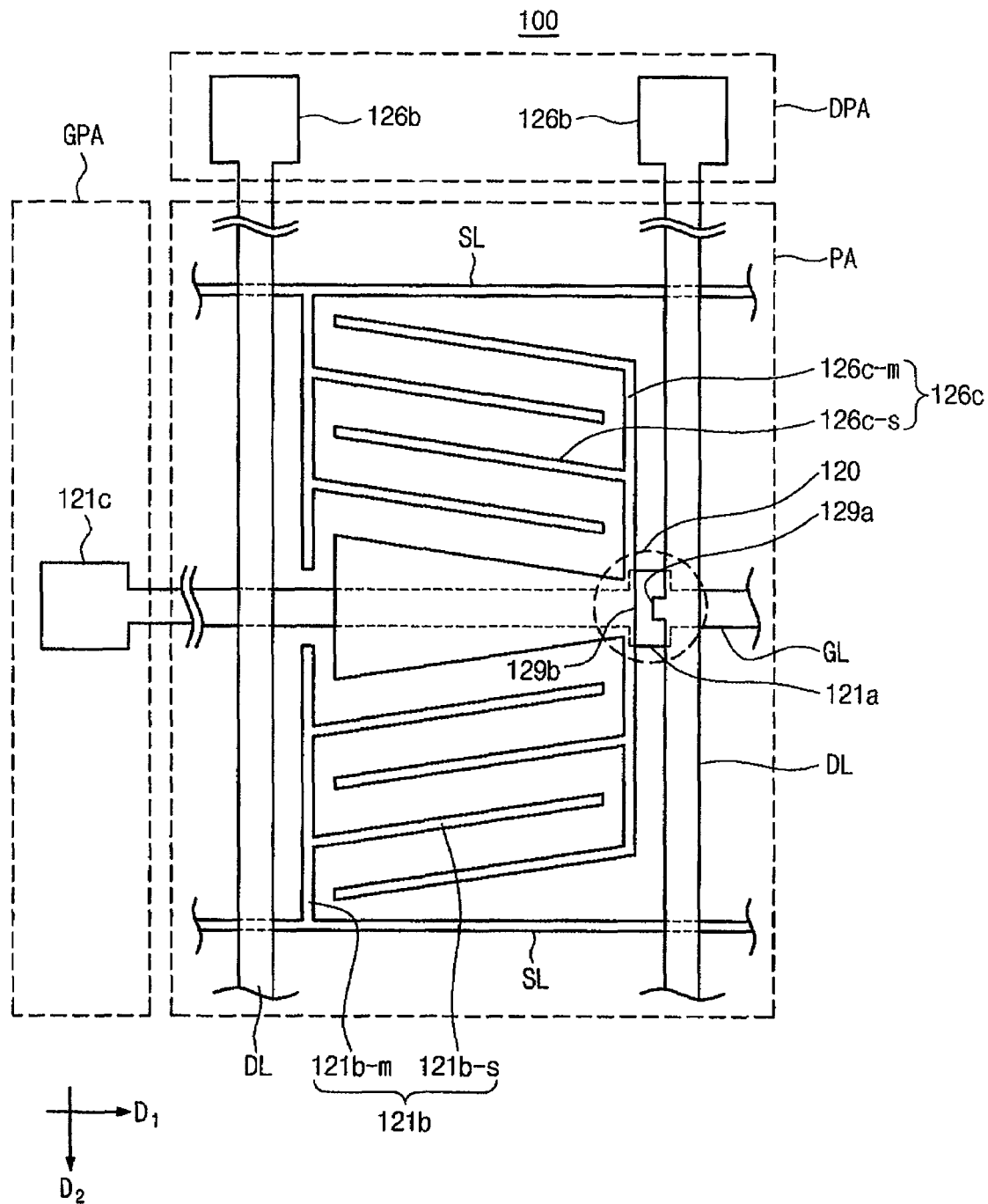
FIG. 1 is a plan view showing an IPS mode array substrate according to an exemplary embodiment of the present invention.

FIG. 1 is a plan view showing an IPS mode array substrate according to an exemplary embodiment of the present invention.

Referring to FIG. 1, an in-plan switching (IPS) mode array substrate 100 includes a first base substrate 110 divided into a pixel area PA in which a plurality of pixels is formed in a matrix configuration and a pad area adjacent to the pixel area PA. The pad area is divided into a gate pad area GPA in which a gate pad 121c is formed and a data pad area DPA in which a data pad 126b is formed.

First base substrate 110 includes a gate line GL, a data line DL, a thin film transistor 120, a pixel electrode 126c and a common electrode 121b which are formed in the pixel area PA.

Gate line GL is extended in a first direction D1 and data line DL is extended in a second direction D2 substantially perpendicular to the first direction D1. Data line DL is intersected with and is insulated from gate line GL. Thin film transistor 120 includes a gate electrode 121a, a source electrode 129a and a drain electrode 129b. Particularly, gate electrode 121a branches from gate line GL, source electrode 129a branches from data line DL, and drain electrode 129b is spaced apart from source electrode 129a and electrically connected to pixel electrode 126c.

Pixel electrode 126c and common electrode 121b are made of a transparent conductive material. Pixel electrode 126c includes a main pixel electrode 126c-m extended in the second direction D2 substantially parallel to data line DL and a plurality of sub pixel electrodes 126c-s that branch from the main pixel electrode 126c-m. The sub pixel electrodes 126c-s are spaced apart from each other and are inclined at a predetermined angle with respect to gate line GL. The sub pixel electrodes 126c-s are extended and substantially parallel to each other. Pixel electrode 126c includes a same material as that of the source and drain electrodes 129a and 129b and branches from drain electrode 129b.

Common electrode 121b includes a main common electrode 121b-m extended in the second direction D2 and a plurality of sub common electrodes 121b-s that branches from main common electrode 121b-m. Main common electrode 121b-m branches from a storage line SL extended in the first direction D1. Sub common electrodes 121b-s are spaced apart from each other in a predetermined distance and are inclined at a predetermined angle with respect to gate line GL. Sub common electrodes 121b-s are substantially parallel to each other. Sub common electrodes 121b-s and the sub pixel electrodes 126c-s are alternately arranged in the second direction D2. Sub common electrodes 121b-s and the sub pixel electrodes 126c-s are spaced apart from each other and substantially parallel to each other. Common electrode 121b includes the same material as that of gate electrode 121a and is substantially simultaneously patterned together with gate electrode 121a.

In the present embodiment, each of sub common electrodes 121b-s has a narrower width than the distance between adjacent sub common and sub pixel electrodes. Each of the sub pixel electrodes 126c-s has a narrower width than the distance between adjacent sub common and sub pixel electrodes.

Common electrode 121b receives a common voltage through the storage line SL, and pixel electrode 126c receives a data voltage output from thin film transistor 120. Thus, a horizontal electric field is generated between common electrode 121b and pixel electrode 126c in the pixel area PA due to the voltage difference between the common voltage and the data voltage.

FIGS. 2A to 2L are cross-sectional views illustrating a method of manufacturing the array substrate shown in FIG. 1.

Referring to FIG. 2A, a gate metal 121 is formed over first base substrate 110. In the present embodiment, gate metal 121 may include aluminum neodymium (AlNd) or copper (Cu). A first photoresist layer 122 is formed over gate metal 121.

As shown in FIG. 2B, a first mask 123 is formed on the first photoresist layer 122. First and second openings 123a and 123b are formed through the first mask 123 corresponding to the pixel area PA, and a third opening 123c is formed through the first mask 123 corresponding to the gate pad area GPA.

When the first photoresist layer 122 is exposed to light using the first mask 123 and developed, the exposed portions of photoresist layer 122, corresponding to the first, second and third openings 123a, 123b and 123c are not removed. Thus, gate metal 121 is exposed through the area from which the first photoresist layer 122 is not removed. Here, the first photoresist layer 122 has a negative type photoresister. However, the first photoresist layer 122 may have a positive type. When the first photoresist layer 122 has the positive type photoresister, the first photoresist layer 122 is exposed to light using a second mask(not shown) having a first light blocking portion, a second light blocking portion and a third light blocking portion corresponding to the first, second and third openings 123a, 123b, 123c, respectively. Thus, the first photoresist layer 122 remains in an area corresponding to the first, second and third light blocking portions.

Referring to FIG. 2C, when gate metal 121 exposed through the areas is etched, the gate metal 122 is removed except in areas where the first photoresist layer remains and which correspond to the first, second and third openings 123a, 123b and 123c.

As shown in FIG. 2D, when the first photoresist layer 122 is stripped, gate electrode 121a, common electrode 121b and the gate pad 121c are formed on first base substrate 110. Particularly, gate electrode 121a and common electrode 121b spaced apart from gate electrode 121a are formed on first base substrate 110 corresponding to the pixel area PA, and the gate pad 121c is formed on first base substrate 110 corresponding to the gate pad area GPA.

Referring to FIG. 2E, gate insulating layer 124 is formed over first base substrate 110 on which gate electrode 121a, common electrode 121b and gate pad 121c are formed. As an example, gate insulation layer 124 may be made of silicon nitride (SiNx) or silicon oxide (SiOx).

An active layer 125 having an amorphous silicon layer 125a and an $n^+$ amorphous silicon layer formed on the amorphous silicon layer 125a are formed on gate insulation layer 124. Then, data metal 126 is deposited on active layer 125 and a second photoresist layer 127 is formed on data metal 126.

Data metal 126 may include a metal material different from that of the gate metal, thereby preventing gate metal 121 from being etched while data metal 126 is etched.

In the present embodiment, data metal 126 may include chromium (Cr), aluminum neodymium (AlNd) or molybdenum (Mo). Particularly, when data metal 126 includes chromium (Cr), gate metal 121 includes aluminum neodymium (AlNd). In case that data metal 126 includes aluminum neodymium (AlNd) or molybdenum (Mo), gate metal 121 includes copper (Cu).

As shown in FIG. 2F, a second mask 128 is disposed on the second photoresist layer 127. A fourth opening 128a, a fifth opening 128c and a slit portion 128b are formed through the second mask 128 corresponding to the pixel area PA, and a sixth opening 128d is formed through the second mask 128 corresponding to the data pad area DPA.

When the second photoresist layer 127 is exposed to light using the second mask 128 and developed the exposed photoresist layer 127, the second photoresist layer 127 is removed from areas except areas corresponding to the fourth, fifth and sixth openings 128a, 128c, 128d. Thus, data metal 126 is exposed through the areas from which the second photoresist layer 127 is removed. Also, the second photoresist layer 127 is partially removed from areas corresponding to the slit portion 128b.

Referring to FIG. 2G, when the exposed data metal 126, the active layer 125 and the gate insulation layer 124 are sequentially etched, data metal 126, the active layer 125 and the gate insulation layer 124 are removed from areas except the areas in which the second photoresist layer 127 is formed, which are corresponding to the fourth, fifth and sixth openings 128a, 128c and 128d. Thus, the data electrode 126a and pixel electrode 126c are formed on first base substrate 110 corresponding to the pixel are PA, and a data pad 126b is formed on first base substrate 110 corresponding to the data pad area DPA.

When the second photoresist layer 122 is etched back, the second photoresist layer 127 is completely removed from the area corresponding to the slit portion 128b such that the data electrode 126a is exposed as shown in FIG. 2H. Further, the thickness of the second photoresist layer 127 corresponding to the fourth, fifth and sixth openings 128a, 128c and 128d is reduced.

Referring to FIG. 2I, the exposed data electrode 126 and the $n^+$ amorphous silicon which correspond to the slit portion 128b are sequentially etched, to form source electrode 129a and drain electrode 129b on first base substrate 110 corresponding to the pixel area PA. Therefore, thin film transistor 120 is completed as a switching device. Then, the second photoresist layer 127 remaining on source electrode 129a, drain electrode 129b, pixel electrode 126c and data pad 126b is stripped, as shown in FIG. 2J.

Referring to FIG. 2K, an organic insulation layer 131 is formed on first base substrate 110 corresponding to the pixel area PA. Organic insulation layer 131 includes an acrylic resin and covers the switching device 120, pixel electrode 126c and common electrode 121b formed on first base substrate 110.

Since the gate pad 121c and data pad 126b have to be exposed in the gate and data pad areas GPA and DPA, organic insulation layer 131 is formed, by a printing method, only in the pixel area PA.

As shown in FIG. 2L, an alignment layer 132 including a polyimide-containing material is formed on organic insulation layer 131. Also, alignment layer 132 is formed only in the pixel area by a printing method to expose gate pad 121b and data pad 126b in the gate and data pad areas GPA and DPA, respectively.

Although not shown in figures, organic insulation layer 131 formed under alignment layer 132 may be removed from first base substrate 110. If organic insulating layer 131 is not used, switching device 120, pixel electrode 126c and common electrode 121b formed on first base substrate 110 are directly covered by alignment layer 132.

As described above, common electrode 121b and gate electrode 121a are substantially simultaneously patterned, and source electrode 129a, drain electrode 129b and pixel electrode 126c are substantially simultaneously patterned, to thereby form the array substrate 100 using only two masks. Thus, the number of the masks used to manufacture the array substrate 100 is reduced and the manufacturing processes for the array substrate 100 have been simplified.

Although not shown in figures, common electrode 121b may be formed using data metal 126. That is, common electrode 121b may be substantially simultaneously patterned with source electrode 129a, drain electrode 129b and pixel electrode 126c, so that common electrode 121b may be formed on a same layer as the layer on which pixel electrode 126c is formed.

FIG. 3 is a cross-sectional view showing another exemplary embodiment of an IPS mode liquid crystal display panel. In FIG. 3, the same reference numerals denote the same elements in FIG. 2L, and thus the detailed description of the same elements will be omitted.

Referring to FIG. 3, the IPS mode liquid crystal display panel 400 includes an array substrate 100, an opposite substrate 200 and a liquid crystal layer 300.

The opposite substrate 200 faces the array substrate 100 and includes a second base substrate 210 and a color filter layer 220 formed on the second base substrate 210. When the array substrate 100 and the opposite substrate 200 are manufactured, the array substrate 100 is assembled with the opposite substrate 200.

Liquid crystal layer 300 is interposed between array substrate 100 and opposite substrate 200, thereby completing the liquid crystal display panel 400.

Liquid crystal layer 300 includes a plurality of liquid crystal molecules which are horizontally aligned due to the horizontal electric field generated between common electrode 121b and pixel electrode 126c. Thus, liquid crystal layer 300 may control transmittance of light provided from a backlight assembly (not shown) arranged at a rear portion of the liquid crystal display panel 400.

According to the manufacturing method for the array substrate and display panel, the common electrode is substantially simultaneously patterned with the gate electrode and the source electrode, the drain electrode and the pixel electrode are substantially simultaneously patterned with each other, thereby forming the array substrate using only two masks.

Thus, a lesser number of the masks are used to manufacture the array substrate and the manufacturing processes for the array substrate 100 are simplified.

Although the exemplary embodiments of the present invention have been described, it is understood that various changes and modifications will be apparent to those skilled in the art and may be made without, however, departing from the spirit and scope of the present invention.

What is claimed is:

1. A method of manufacturing an array substrate, comprising:
    forming a gate metal on a base substrate;
    patterning the gate metal using a first mask to form a gate part having a gate electrode, a gate line and a gate pad;
    sequentially forming a gate insulating layer, an active layer and a data metal on the base substrate covering the gate part; and
    patterning the data metal, the active layer and the gate insulating layer using a second mask to form a data part having a data electrode, a data pad and a pixel electrode, wherein the data metal, the active layer, and the gate insulating layer are removed from areas except areas in which the second mask is formed, and
    the data electrode is divided into a source electrode and a drain electrode to complete a switching device.

2. The method of claim 1, wherein the data part is formed by:
    forming a second photoresist layer on the data metal;
    patterning the second photoresist layer using the second mask to remove the second photoresist layer except from a first area in which the data part is formed and to partially remove the second photoresist layer from a second area between the source electrode and the drain electrode of the first area; and
    removing an exposed portion of the data metal to form the data part.

3. The method of claim 2, wherein the switching device is completed by:
    etching the second photoresist layer such that the second photoresist layer is removed from the second area;
    removing the data electrode exposed in the second area to form the source and drain electrodes in the first area;
    partially removing an exposed portion of the active layer from the second area;
    removing an exposed portion of the gate insulating layer; and
    stripping the second photoresist layer.

4. The method of claim 3, wherein the active layer comprises an amorphous silicon layer and an $n^+$ amorphous silicon layer formed on the amorphous silicon layer, and the $n^+$ amorphous silicon layer is removed from the second area.

5. The method of claim 2, wherein the partially removing of the second photoresist layer from the second area comprises a slit exposing of the second photoresist layer.

6. The method of claim 2, wherein the gate part is formed by:
    forming a first photoresist layer on the gate metal;
    patterning the first photoresist layer using the first mask to remove the first photoresist layer from an area except an area in which the gate part is formed;
    removing an exposed portion of the gate metal to form the gate part; and
    stripping the first photoresist layer that is residual on the gate part.

7. The method of claim 1, wherein the gate metal comprises a metal different from that of the data metal.

8. The method of claim 7, wherein the gate metal comprises aluminum neodymium and the data metal comprises chromium.

9. The method of claim 7, wherein the gate metal comprises copper, and the data metal comprises aluminum or molybdenum.

10. The method of claim 1, further comprising forming an alignment layer after the switching device is completed.

11. The method of claim 10, further comprising forming an organic insulation layer before the alignment layer is formed.

12. The method of claim 11, wherein the base substrate comprises a pixel area in which the gate line, the data line, the switching device and the pixel electrode are formed and a pad area adjacent to the pixel area, in which the gate pad and the data pad are formed, and the alignment layer and the organic insulation layer are formed in the pixel area.

13. The method of claim 12, wherein the alignment layer and the organic insulation layer are formed in the pixel area by a printing method.

14. The method of claim 1, wherein the gate part further comprises a common electrode formed from the gate metal.

15. The method of claim 14, wherein the common electrode comprises a plurality of sub-common electrodes spaced apart from each other in a predetermined distance and a main common electrode that electrically connects the sub-common electrodes to each other.

16. The method of claim 15, wherein the pixel electrodes comprises a plurality of sub-pixel electrodes spaced apart from each other in a predetermined distance and a main pixel electrode that electrically connects the sub-pixel electrodes to each other, and the sub-pixel electrodes are alternately arranged with the sub-common electrodes.

17. The method of claim 16, wherein each of the sub-common electrodes has a width smaller than a distance between the sub-common and sub-pixel electrodes adjacent to each other.

18. A method of fabricating a display panel, the method comprising:
    fabricating an array substrate;
    fabricating an opposite substrate facing the array substrate; and
    assembling the array substrate with the opposite substrate,
        wherein the fabricating of the array substrate comprises:
    forming a gate metal on a base substrate;
    patterning the gate metal using a first mask to form a gate part having a gate electrode, a gate line and a gate pad;
    sequentially forming a gate insulating layer, an active layer and a data metal on the base substrate to cover the gate part; and
    patterning the data metal, the active layer and the gate insulating layer using a second mask to form a data part having a data electrode, a data pad and a pixel electrode,
    wherein the data metal, the active layer, and the gate insulating layer are removed from areas except areas in which the second mask is formed, and
    the data electrode is divided into a source electrode and a drain electrode to complete a switching device.

19. The method of claim 18, further comprising forming a liquid crystal layer between the array substrate and the opposite substrate.

* * * * *